United States Patent
Ju et al.

(10) Patent No.: US 11,537,176 B2
(45) Date of Patent: Dec. 27, 2022

(54) ELECTRIC DEVICE WITH HIGH SCREEN RATIO

(71) Applicant: Acer Incorporated, New Taipei (TW)

(72) Inventors: Tai Ju, New Taipei (TW); Chueh-Pin Ko, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 464 days.

(21) Appl. No.: 16/837,438

(22) Filed: Apr. 1, 2020

(65) Prior Publication Data
US 2020/0348733 A1 Nov. 5, 2020

(30) Foreign Application Priority Data
Apr. 30, 2019 (TW) ................... 108205307

(51) Int. Cl.
*G06F 1/00* (2006.01)
*G06F 1/16* (2006.01)
*H05K 1/02* (2006.01)
*H05K 1/18* (2006.01)
*G06F 3/044* (2006.01)

(52) U.S. Cl.
CPC .......... *G06F 1/1683* (2013.01); *G06F 1/1601* (2013.01); *G06F 1/1643* (2013.01); *G06F 3/0443* (2019.05); *G06F 3/0446* (2019.05); *H05K 1/0281* (2013.01); *H05K 1/189* (2013.01); *G06F 2203/04112* (2013.01); *H05K 2201/05* (2013.01); *H05K 2201/09454* (2013.01); *H05K 2201/10128* (2013.01)

(58) Field of Classification Search
CPC .... G06F 1/1683; G06F 3/0446; G06F 3/0443; G06F 1/1601; G06F 1/1643; G06F 2203/04112; H05K 1/0281; H05K 1/189; H05K 2201/05; H05K 2201/09454; H05K 2201/1012
See application file for complete search history.

(56) References Cited

U.S. PATENT DOCUMENTS

| | | | |
|---|---|---|---|
| 2014/0092036 A1* | 4/2014 | Lin | G06F 3/0412 345/173 |
| 2014/0218629 A1* | 8/2014 | Chuang | G06F 3/045 349/12 |
| 2017/0262117 A1* | 9/2017 | Huang | G06F 3/04164 |

* cited by examiner

*Primary Examiner* — Pete T Lee
(74) *Attorney, Agent, or Firm* — Birch, Stewart, Kolasch & Birch, LLP

(57) ABSTRACT

An electric device is provided. The electric device includes a first housing, a second housing, a touch panel, a flexible printed circuit board, a control chip, and a main circuit board. The touch panel is disposed in the first housing. The flexible printed circuit board includes a substrate, a plurality of first connecting lines, a plurality of second connecting lines and a plurality of third connecting lines. The substrate has a first surface and a second surface. The first connecting lines are connected to a first peripheral line on the first surface. The second connecting lines are connected to a second peripheral line on the first surface. The third connecting lines are connected to a third peripheral line on the second surface, and are arranged from the second surface to the first surface through a plurality of first through holes.

20 Claims, 5 Drawing Sheets

ELECTRIC DEVICE WITH HIGH SCREEN RATIO

This application claims the benefit of Taiwan application Serial No. 108205307, filed Apr. 30, 2019, the subject matter of which is incorporated herein by reference.

BACKGROUND OF THE INVENTION

Field of the Invention

The present invention relates to an electronic device with a high screen ratio, and more particularly to an electronic device configured with a touch panel.

Description of the Related Art

With the continuous improvement of process technology, various touch products are constantly being innovated. Among the touch products, the touch panel is the main human machine interface, and is also the area where the user's eyes stay the longest. The higher the screen ratio (the ratio of the touch panel to the whole frame) is, the more broad the tactile experience can be, and the size of the product can be correspondingly reduced.

SUMMARY OF THE UTILITY MODEL

The invention relates to an electric device in which a control chip of a touch panel is disposed on a main circuit board, so that the screen ratio of the product is improved. Moreover, a single-sided configuration line method is used for the flexible printed circuit board connecting the control chip and the touch panel in the bending area, which effectively improves the reliability of the flexible printed circuit board. In this way, the screen ratio of the product can be improved without reducing the product reliability.

According to an aspect of the present invention, an electronic device is proposed. The electric device includes a first housing, a second housing, a touch panel, a flexible printed circuit board, a control chip, and a main circuit board. The touch panel is disposed in the first housing. The touch panel has a first side, a second side, a third side, and a fourth side. The first side is opposite to the second side, the third side is connected to the first side and the second side. The touch panel comprises a plurality of first electrodes, a plurality of second electrodes, a plurality of first peripheral lines, a plurality of second peripheral lines, and a plurality of third peripheral lines. The first peripheral lines connect part of the first electrodes at the first side. The second peripheral lines connect part of the first electrodes at the second side. The third peripheral lines connect the second electrodes at the third side. A flexible printed circuit board comprises a substrate, a plurality of first connecting lines, a plurality of second connecting lines, and a plurality of third connecting lines. The substrate has a first surface and a second surface. The first connecting lines connect the first peripheral lines at the first surface. The second connecting lines connect the second peripheral lines at the first surface. The third connecting lines connect the third peripheral lines at the second surface, and being arranged from the second surface to the first surface through a plurality of first through holes. A control chip connects the first connecting lines, the second connecting lines, and the third connecting lines. A main circuit board is disposed in the second housing. The control chip is disposed on the main circuit board.

The above and other aspects of the creation will become better understood with regard to the following detailed description of the preferred but non-limiting embodiment(s). The following description is made with reference to the accompanying drawings.

DETAILED DESCRIPTION OF THE INVENTION

Figure 1:
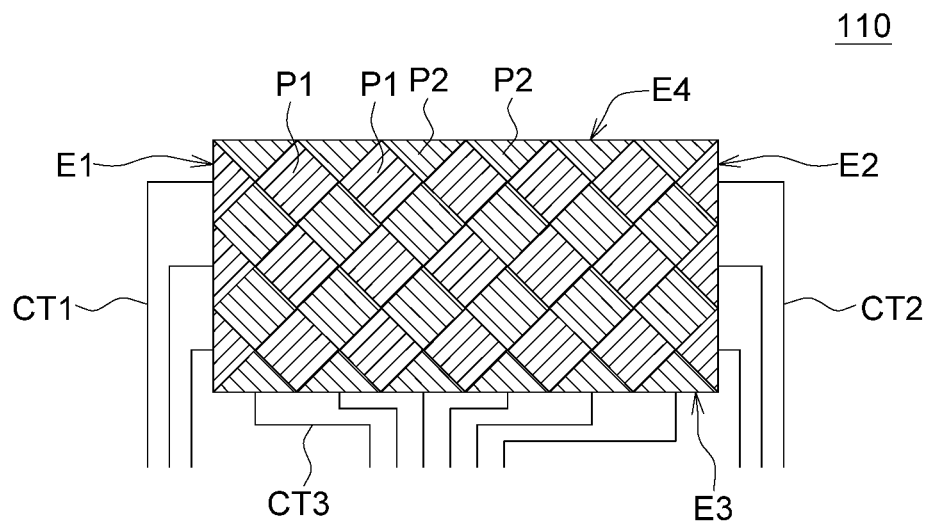
FIG. 1 shows a schematic diagram of a touch panel according to an embodiment.

Referring to FIG. 1, it shows a schematic diagram of a touch panel 110 according to an embodiment. In an embodiment, the touch panel 110 can provide an intuitive manipulation in combination with the display panel. In another embodiment, the touch panel 110 may also be used separately without being combined with the display panel. The touch panel 110 has a first side E1, a second side E2, a third side E3, and a fourth side E4. The first side E1 is opposite to the second side E2, and the third side E3 is connected to the first side E1 and the second side E2. The touch panel 110 comprises a plurality of first electrodes P1, a plurality of second electrodes P2, a plurality of first peripheral lines CT1, a plurality of second peripheral lines CT2, and a plurality of third peripheral lines CT3. The first electrodes P1 and the second electrodes P2 are, for example, a driving electrode (Tx) and a sensing electrode (Rx) respectively; or, the first electrodes P1 and the second electrodes P2 are, for example, a sensing electrode (Rx) and a driving electrode (Tx) respectively. The first electrodes P1 and the second electrodes P2 are disposed on different surfaces of the touch panel 110.

The first peripheral lines CT1 are connected to part of the first electrodes P1 at the first side E1. The second peripheral lines CT2 are connected to part of the first electrodes P1 at the second side E2. In an embodiment, the first peripheral lines CT1 are connected to the first electrodes P1 having odd numbers, and the second peripheral lines CT2 are connected to the first electrodes P1 having even numbers. In another embodiment, the first peripheral lines CT1 are connected to the first electrodes P1 having even numbers, and the second peripheral lines CT2 are connected to the first electrodes P1 having odd numbers. In another embodiment, each of the first peripheral lines CT1 is connected to the left half side of each of the first electrodes P1, and each of the second peripheral lines CT2 is connected to the right half side of each of the first electrodes P1.

The third peripheral lines CT3 are connected to the second electrodes P2 at the third side E3. In an embodiment, the third peripheral lines CT3 are connected to all of the second electrodes P2.

Figure 2:
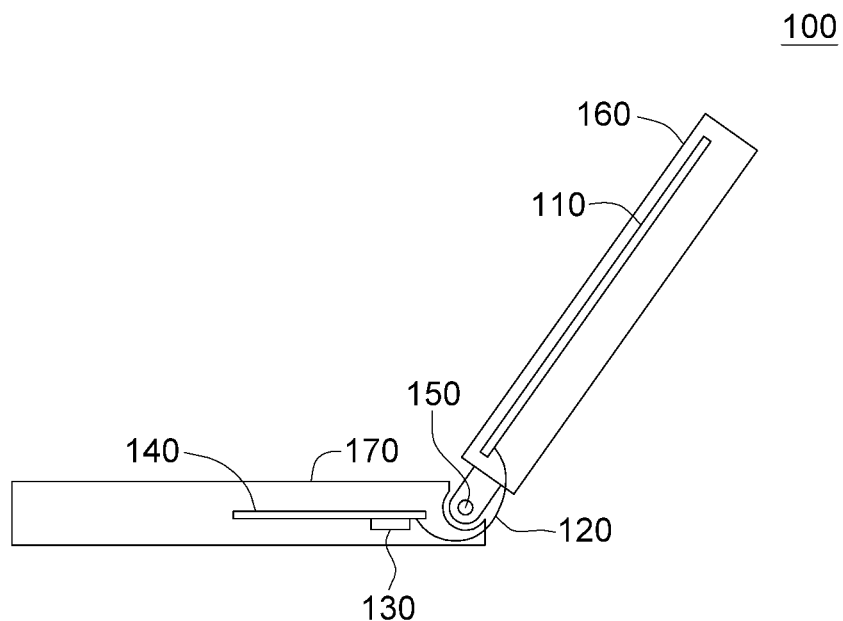
FIG. 2 shows a schematic diagram of an electric device according to an embodiment.

Referring to FIG. 2, it shows a schematic diagram of an electric device 100 according to an embodiment. The electronic device 100 comprises a touch panel 110, a flexible printed circuit board 120, a control chip 130, a main circuit board 140, a rotating shaft 150, a first housing 160, and a second housing 170. The touch panel 110 is disposed on the first housing 160. The main circuit board 140 is disposed in the second housing 170. The control chip 130 is disposed on the main circuit board 140. The flexible printed circuit board 120 is used to connect the touch panel 110 and the control chip 130.

In present embodiment, since the control chip 130 is disposed on the main circuit board 140 instead of being disposed in the first housing 160, the width of the lower frame of the first housing 160 can be greatly reduced. The touch panel 110 can be closely attached to the lower edge of the first housing 160 without leaving a space for disposing the control chip 130. Therefore, the screen ratio can be greatly improved. The researchers found that the present embodiment is capable of greatly reducing the width of the lower frame of the first housing 160 from 25 mm to 7-9 mm.

In order to enable the control chip 130 to be disposed in the second housing 170, the present embodiment connects the control chip 130 and the touch panel 110 with the flexible printed circuit board 120. In present application, the line configuration of the flexible printed circuit board 120 is further adjusted to improve the reliability of the flexible printed circuit board 120. In this way, the screen ratio of the product can be improved without reducing the product reliability.

Figure 3:
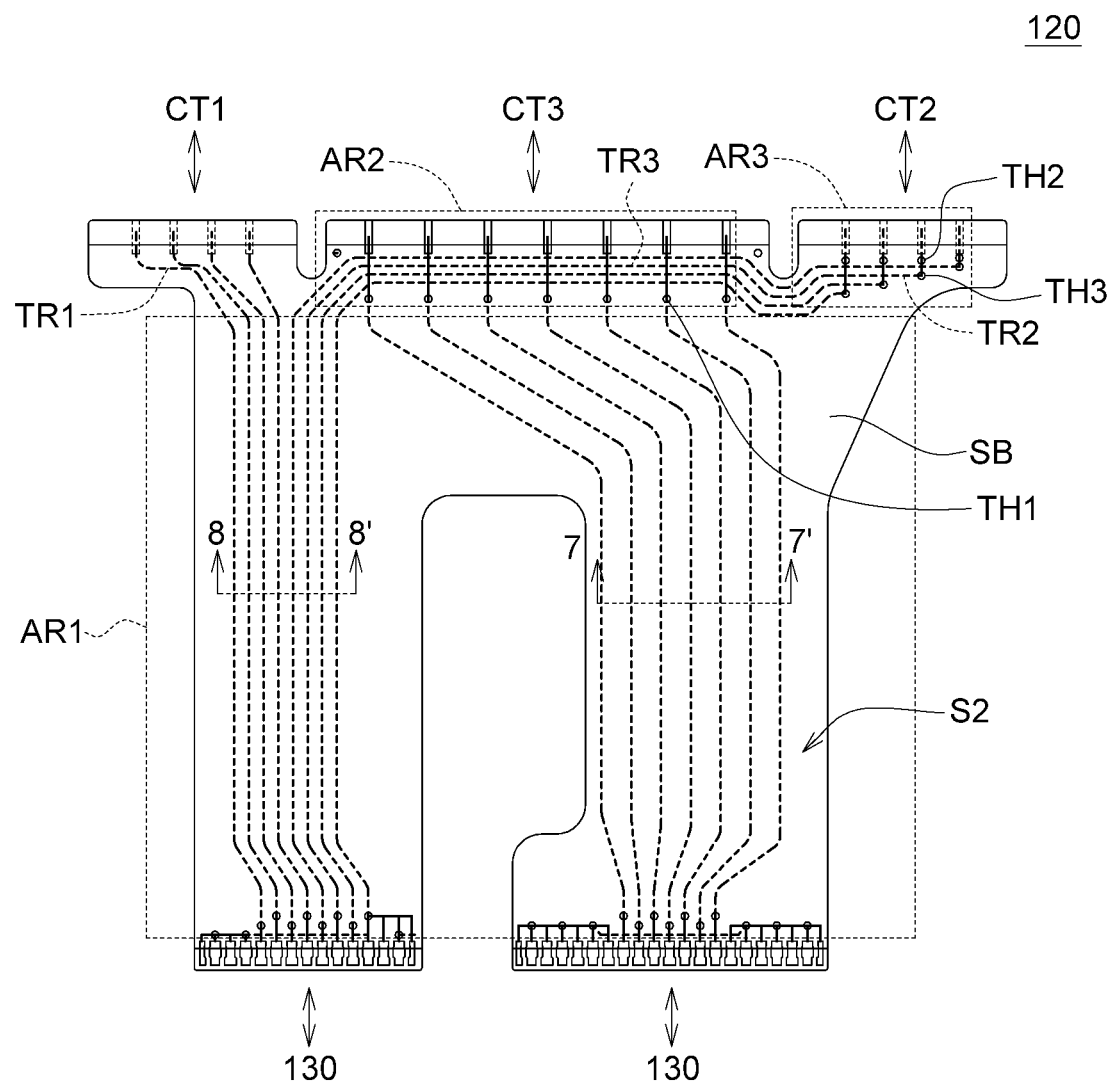
FIG. 3 shows a top view of a flexible printed circuit board according to an embodiment.

Referring to FIG. 3, it shows a top view of a flexible printed circuit board 120 according to an embodiment. As shown in FIG. 3, the flexible printed circuit board 120 comprises a substrate SB, a plurality of first connecting lines TR1, a plurality of second connecting lines TR2, a plurality of third connecting lines TR3, and a protection layer PT (shown in FIG. 5). The substrate SB has a first surface S1 (shown in FIG. 5) and a second surface S2. FIG. 3 is a top view watched from the second surface S2, so the first surface S1 is not marked. In FIG. 3, the broken line indicates the lines disposed on the first surface S1, and a solid line indicates the lines disposed on the second surface S2. After the flexible printed circuit board 120 is connected to the control chip 130, the control chip 130 is connected to the first peripheral lines CT1, the second peripheral lines CT2, and the third peripheral lines CT3 through the first connecting lines TR1, the second connecting lines TR2, and the third connecting lines TR3.

As shown in FIG. 3, the first connecting lines TR1 are connected to the first peripheral lines CT1 at the first surface S1. The second connecting lines TR2 are connected to the second peripheral lines CT2 at the first surface S1.

Figure 4:
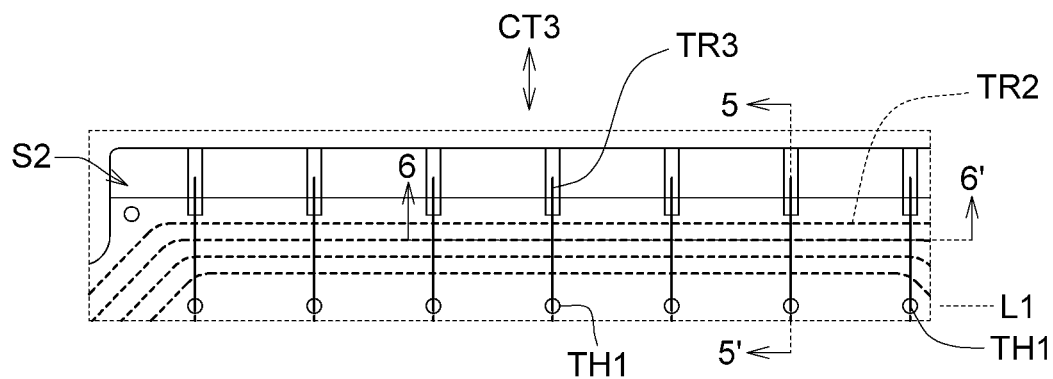
FIG. 4 shows a partial enlarged view of FIG. 3.

Referring to FIG. 4, it shows a partial enlarged view of FIG. 3. The third connecting lines TR3 are connected to the third peripheral lines CT3 at the second surface S2, and are arranged from the second surface S2 to the first surface S1 through the first through holes TH1 (shown in FIG. 5).

Figure 5:
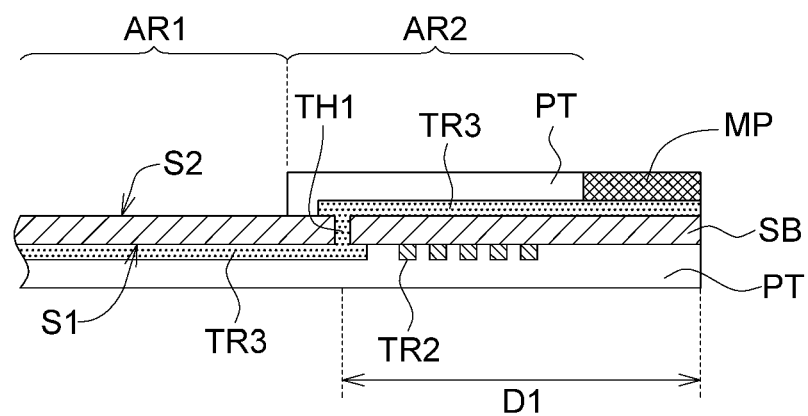
FIG. 5 shows a sectional view taken along the section line 5-5' of FIG. 4.

Referring to FIG. 5, it shows a sectional view taken along the section line 5-5' of FIG. 4. As is clear from FIG. 5, the third connecting lines TR3 can be above and below the substrate SB. On the second surface S2, the third connecting lines TR3 are extended from the lower side of the metal pad MP (also known as the gold finger) to the first through holes TH1. After penetrating through the first through holes TH1, the third connecting lines TR3 are extended from the first through holes TH1 on the first surface S1, and are not arranged back to the second surface S2 after entering the bending area AR1. In this way, the third connecting lines TR3 can be arranged from the second surface S2 to the first surface S1, and the first connecting lines TR1 and the second connecting lines TR2 are both located on the first surface S1.

As shown in FIG. 5, the first through holes TH1 are arranged along a first straight line L1. The distance D1 between the first through holes TH1 and an edge of the substrate SB is 3.0 to 4.0 mm.

As shown in FIG. 3, the flexible printed circuit board 120 has a line interlacing area AR2, and a partially enlarged view shown in FIG. 4 corresponds to part of the line interlacing area AR2 and part of the bending area AR1. As shown in FIG. 5, since the second connecting lines TR2 must approach the first connecting lines TR1, the third connecting lines TR3 are arranged to the first surface S1 through the first through holes TH1 after crossing over the second connecting lines TR2. The number of the second connecting lines TR2 shown in FIG. 5 is merely illustrative. In an embodiment, all of the second connecting lines TR2 approach the first connecting lines TR1.

Figure 6:
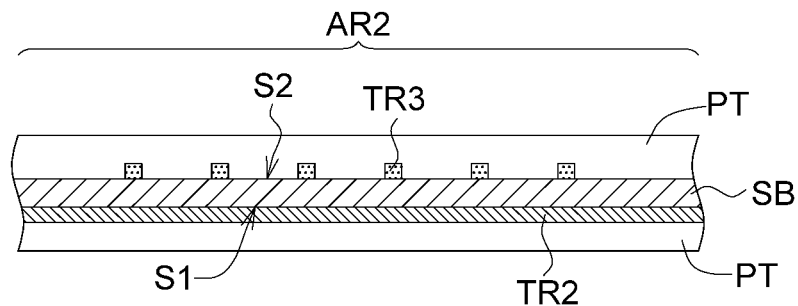
FIG. 6 shows a sectional view taken along the section line 6-6' of FIG. 4.

Referring to FIG. 6, it shows a sectional view taken along the section line 6-6' of FIG. 4. As is clear from FIG. 6, in the line interlacing area AR2, the third connecting lines TR3 are located on the second surface S2, and the second connecting lines TR2 are located on the first surface S1.

As shown in FIGS. 5-6, in the bending area AR1, the protective layer PT only covers the first surface S1. In the line interlacing area AR2, the protective layer PT covers the first surface S1 and the second surface S2. That is, the protective layer PT covers the entire first surface S1, but covers only a portion of the second surface S2. In this way, in the bending area AR1, the flexible printed circuit board 120 has the protective layer PT disposed only on the first surface S1, and therefore the thickness can be greatly reduced. Through experiments, it has been found that reducing the thickness of the flexible printed circuit board 120 can effectively improve the reliability.

In addition, the second surface S2 of the substrate SB of the flexible printed circuit board 120 may be faced to the rotating shaft 150 (as shown in FIG. 2) to prevent the first connecting lines TR1, the second connecting lines TR2, and the third connecting lines TR3 located on the first surface S1 and the rotating shaft 150 from being rubbed. In another embodiment, the first surface S1 of the substrate SB of the flexible printed circuit board 120 may also be faced to the rotating shaft 150.

Figure 7:
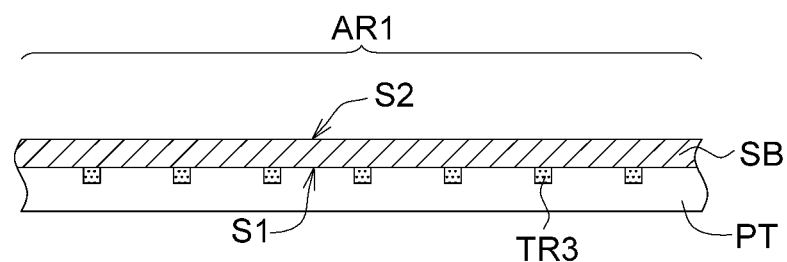
FIG. 7 shows a sectional view taken along the section line 7-7' of FIG. 3.

Referring to FIG. 7, it shows a sectional view taken along the section line 7-7' of FIG. 3. The range of the sectional view of FIG. 7 is located in the bending area AR1. As can be seen from FIG. 7, in the bending area AR1, the third connecting lines TR3 are laid on the first surface S1. The protective layer PT only covers the first surface S1.

Figure 8:
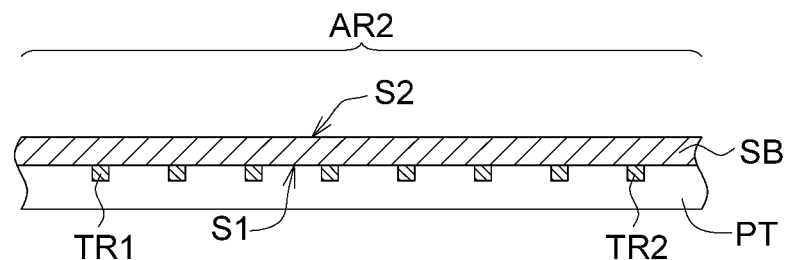
FIG. 8 shows a sectional view taken along the section line 8-8' of FIG. 3.

Referring to FIG. 8, it shows a sectional view taken along the section line 8-8' of FIG. 3. The range of the sectional view of FIG. 8 is located in the bending area AR1. As can be seen from FIG. 8, in the bending area AR1, the first connecting lines TR1 and second connecting lines TR2 are laid on the first surface S1. The protective layer PT only covers the first surface S1.

Figure 9:
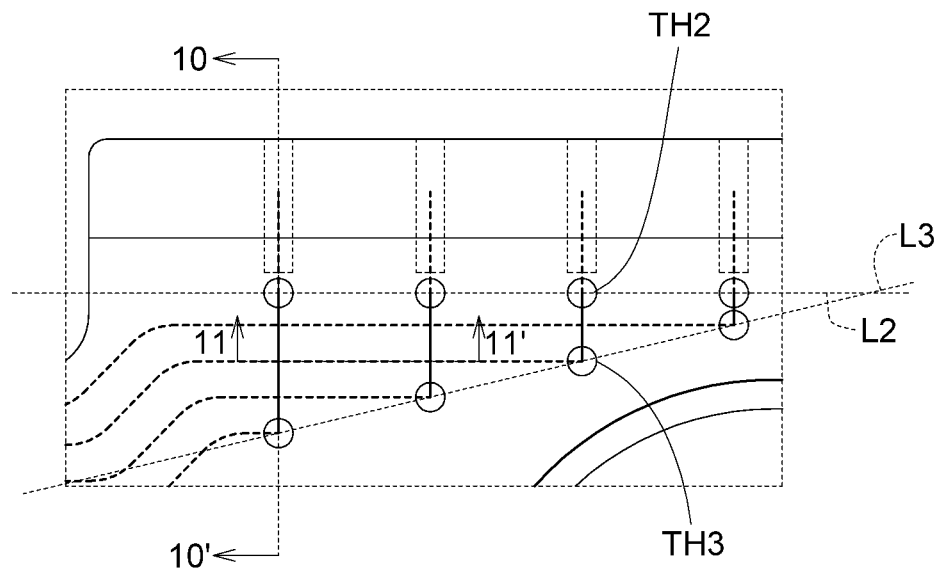
FIG. 9 shows a partial enlarged view of FIG. 3.

As shown in FIG. 3, the flexible printed circuit board 120 further has a line turning area AR3. Referring to FIG. 9, it shows a partial enlarged view of FIG. 3. The partially enlarged view shown in FIG. 9 corresponds to part of the line turning area AR3. The third connecting lines TR3 are turned in the line turning area AR3, such that the third connecting lines TR3 approach the first connecting lines TR1 (shown in FIG. 3).

Figure 10:
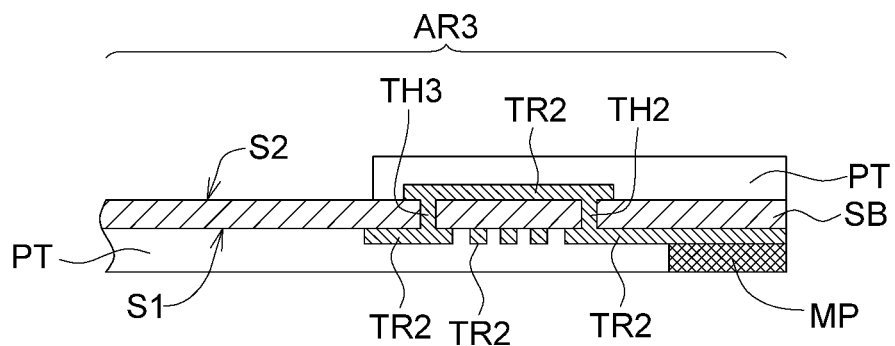
FIG. 10 shows a sectional view taken along the section line 10-10' of FIG. 9.

Referring to FIG. 10, it shows a sectional view taken along the section line 10-10' of FIG. 9. On the first surface S1, the second connecting lines TR2 are extended from the metal pad MP to the second through holes TH2. After that, after the second connecting lines TR2 pass through the second through holes TH2, at the second surface S2, the second connecting lines TR2 are extended from the second through holes TH2 to the third through holes TH3. Then, after the second connecting lines TR2 pass through the third through holes TH3, the second connecting lines TR2 are extended toward another direction on the first surface S1. In this way, the second connecting lines TR2 can be arranged from the first surface S1 to the second surface S2, and then be arranged from the second surface S2 to the first surface S1 through the second through holes TH2 and the third through holes TH3. Through the design of changing the surface twice, the second connecting lines TR2 can complete the quarter turning, which greatly reduces the area required for turning.

Figure 11:
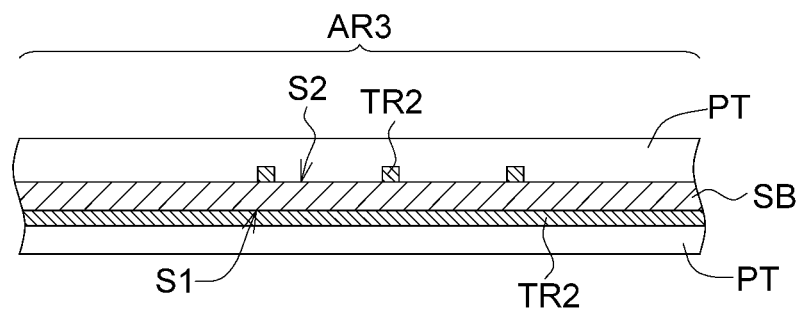
FIG. 11 shows a sectional view taken along the section line 11-11' of FIG. 9.

Referring to FIG. 11, it shows a sectional view taken along the section line 11-11' of FIG. 9. As is clear from FIG. 11, in the line turning area AR3, the second connecting lines TR2 whose layer has been changed once is located on the second surface S2, and the second connecting lines TR2 whose layer has been changed twice is located on the first surface S1.

As shown in FIG. 9, the second through holes TH2 are arranged along a second straight line L2, and the third through holes TH3 are arranged along a third straight line L3. The angle between the second straight line L2 and the third straight line L3 is an acute angle. In this way, the arrangement order of the second connecting lines TR2 can be reversed to match the pin order of the control chip 130.

Through the above embodiment, the control chip 130 is disposed on the main circuit board 140, so that the touch panel 110 can be closely attached to the lower edge of the first housing 160 without leaving a space for disposing the control chip 130, thereby improving the screen ratio of the product. Moreover, a single-sided configuration line method is used for the flexible printed circuit board 120 in the bending area AR1, which effectively improves the reliability of the flexible printed circuit board 120. In this way, the screen ratio of the product can be improved without reducing the product reliability.

While the creation has been described by example and in terms of the preferred embodiment(s), it is to be understood that the utility model is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electric device, comprising:
   a first housing;
   a second housing;
   a touch panel disposed in the first housing, wherein the touch panel has a first side, a second side, a third side, and a fourth side, the first side is opposite to the second side, the third side is connected to the first side and the second side, and the touch panel comprises:
   a plurality of first electrodes;
   a plurality of second electrodes;
   a plurality of first peripheral lines connecting part of the first electrodes at the first side;
   a plurality of second peripheral lines connecting part of the first electrodes at the second side; and
   a plurality of third peripheral lines connecting the second electrodes at the third side;
   a flexible printed circuit board, comprising:
   a substrate having a first surface and a second surface;
   a plurality of first connecting lines connecting the first peripheral lines at the first surface;
   a plurality of second connecting lines connecting the second peripheral lines at the first surface; and
   a plurality of third connecting lines connecting the third peripheral lines at the second surface, and being arranged from the second surface to the first surface through a plurality of first through holes;
   a control chip connecting the first connecting lines, the second connecting lines, and the third connecting lines; and
   a main circuit board disposed in the second housing, wherein the control chip is disposed on the main circuit board.

2. The electric device according to claim 1, wherein the flexible printed circuit board has a bending area, in the bending area, the first connecting lines, the second connecting lines, and the third connecting lines are laid on the first surface.

3. The electric device according to claim 2, wherein the flexible printed circuit board further comprises:
   a protective layer, wherein in the bending area, the protective layer only covers the first surface.

4. The electric device according to claim 2, wherein the flexible printed circuit board further comprises:
   a protective layer covering the first surface and part of the second surface.

5. The electric device according to claim 1, wherein the flexible printed circuit board has a line interlacing area, and in the line interlacing area, the third connecting lines cross over the second connecting lines.

6. The electric device according to claim 5, wherein in the line interlacing area, the second connecting lines are laid on the first surface, and the third connecting lines are laid on the second surface.

7. The electric device according to claim 5, wherein in the line interlacing area, the third connecting lines are arranged from the second surface to the first surface through the first through holes.

8. The electric device according to claim 5, wherein the flexible printed circuit board further comprises:
   a metal pad, wherein on the second surface, the third connecting lines are extended from the metal pad to the first through holes.

9. The electric device according to claim 1, wherein the flexible printed circuit board has a line turning area, in the line turning area, the second connecting lines are arranged from the first surface to the second surface through a plurality of second through holes, and the second connecting lines are arranged from the second surface to the first surface through a plurality of third through holes.

10. The electric device according to claim 9, wherein the third connecting lines are turned in the line turning area, such that the third connecting lines approach the first connecting lines.

11. The electric device according to claim 9, wherein the flexible printed circuit board further comprises:

a metal pad, wherein on the first surface, the second connecting lines are extended from the metal pad to the second through holes.

12. The electric device according to claim 9, wherein the first through holes are arranged along a first straight line, the plurality of second through holes are arranged along a second straight line, the plurality of third through holes are arranged along a third straight line, and an angle between the second straight line and the third straight line is an acute angle.

13. The electric device according to claim 9, wherein a distance between the first through holes and an edge of the substrate is 3.0 to 4.0 mm.

14. The electric device according to claim 1, further comprising:
a rotating shaft, wherein the second surface is faced to the rotating shaft.

15. The electric device according to claim 1, wherein the first electrodes and the second electrodes are driving electrodes and sensing electrodes respectively, or the first electrodes and the second electrodes are sensing electrodes and driving electrodes respectively.

16. The electric device according to claim 1, wherein the first electrodes and the second electrodes are disposed on different surfaces of the touch panel.

17. The electric device according to claim 1, wherein the first peripheral lines are connected to the first electrodes having odd numbers, and the second peripheral lines are connected to the first electrodes having even numbers; or, the first peripheral lines are connected to the first electrodes having odd numbers, and the second peripheral lines are connected to the first electrodes having even numbers.

18. The electric device according to claim 1, wherein each of the first peripheral lines is connected to a left half side of each of the first electrodes, and each of the second peripheral lines is connected to a right half side of each of the first electrodes.

19. The electric device according to claim 1, wherein the flexible printed circuit board is used to connect the touch panel and the control chip.

20. The electric device according to claim 1, wherein a width of a lower frame of the first housing is 7-9 mm.

* * * * *